United States Patent [19]

Ast et al.

[11] 4,366,024

[45] Dec. 28, 1982

[54] PROCESS FOR MAKING SOLAR CELL BASE MATERIAL

[75] Inventors: Gerhard Ast, Emmerting; Josef Dietl, Neuötting; Dieter Helmreich, Burghausen; Hans-Dieter Miller, Stammham; Erhard Sirtl, Marktl/Inn, all of Fed. Rep. of Germany

[73] Assignee: Heliotronic Forschungs-und Entwicklungsgesellschaft fur Solarzellen-Grundstoffe mbH, Burghausen, Fed. Rep. of Germany

[21] Appl. No.: 115,317

[22] Filed: Jan. 25, 1980

[30] Foreign Application Priority Data

Jan. 26, 1979 [DE] Fed. Rep. of Germany ....... 2903061

[51] Int. Cl.³ ............................................. C30B 11/02
[52] U.S. Cl. .................................... 156/607; 156/619; 423/348
[58] Field of Search ............... 156/607, 617 H, 619, 156/DIG. 64, DIG. 83, DIG. 88, DIG. 97, 608, 601; 148/172; 423/348

[56] References Cited

U.S. PATENT DOCUMENTS

| | | | |
|---|---|---|---|
| 2,872,299 | 2/1959 | Celmer et al. | 156/607 |
| 3,218,143 | 11/1965 | Lajarte | 156/607 |
| 3,899,304 | 8/1975 | Linares | 156/607 |
| 4,022,652 | 5/1977 | Hirano et al. | 156/608 |
| 4,036,595 | 7/1977 | Lorenzini | 156/601 |
| 4,058,418 | 11/1977 | Lindmayer | 156/607 |
| 4,226,834 | 10/1980 | Shudo et al. | 156/DIG. 97 |

FOREIGN PATENT DOCUMENTS

| | | |
|---|---|---|
| 2633961 | 2/1977 | Fed. Rep. of Germany ... 156/DIG. 97 |
| 52-61180 | 5/1977 | Japan ............... 156/617 H |

Primary Examiner—Hiram Bernstein
Attorney, Agent, or Firm—Allison C. Collard; Thomas M. Galgano

[57] ABSTRACT

Competitive current generation by the exploitation of solar energy requires cheap solar cells. A process is described which makes it possible to manufacture from silicon a base material for solar cells of this type in an economical manner and in large quantities. This is achieved by bringing silicon from a supply container into contact with a non-elemental lubricating melt, which is immiscible with silicon but will not wet silicon and has a melting point below that of silicon, and by drawing off a silicon film, sliding on this lubricating melt, and solidifying the silicon continuously by cooling to below its' melting point.

12 Claims, 3 Drawing Figures

PROCESS FOR MAKING SOLAR CELL BASE MATERIAL

The present invention relates to a process for the manufacture of granular crystalline silicon sheets of preferred orientation, having a thickness of between 0.2 and 2 mm, which are intended for use as a base material for solar cells. More particularly, it relates to such a process wherein a silicon melt is brought into contact with a second molten phase and is subsequently allowed to solidify.

Solar cells, which have been used for a long time as current generators in space travel, are far too expensive for large-scale terrestrial application. Solar cells of this type are manufactured from monocrystalline silicon which is produced according to one of the two classic processes—namely, crucible-pulling according to Czochralski, or crucible-free zone-melting. In the finishing alone of the silicon rods obtained according to these processes, at least 50% of the material is lost, so that, from the start, these techniques are ruled out for the large-scale production of solar cell base material.

In the meantime, numerous processes have become known with the aim of manufacturing cheap, monocrystalline silicon material. Common to most of these processes is the attempt to obtain silicon directly in strip-form, in order, in this way, to save the costly and material-consuming sawing stage. This is achieved, for example, by pulling a strip of monocrystalline silicon from a supply rod of polycrystalline silicon by means of a shaping nozzle.

According to the EFG process, monocrystalline silicon is drawn upwards, in the form of a strip, for example, by means of a shaping capillary member which is made of carbon and is dipped into the silicon melt. According to Bleil's process, the silicon is melted in a melting crucible, and, under the influence of a temperature gradient, a silicon strip is drawn off to the side by a seed crystal. At the same time the melt in the crucible is maintained at a constant level by a system of displacement members dipping into the melt. Finally, according to Shockley's process, strip-shaped silicon is obtained by melting a polycrystalline supply rod on molten lead and, under the influence of a temperature gradient and with the aid of a seed crystal, drawing off the silicon from this lead film horizontally in the form of a strip.

The economic viability of the above-mentioned processes is restricted by the low pulling speeds, which are on the order of a few centimeters per minute. In the last-mentioned process, an additional difficulty is that the lead used as the substrate surface must be extraordinarily pure, so that the silicon that is melted and solidified on the lead is not contaminated. A further disadvantage is the high vapor pressure of lead, which leads unavoidably to deposits of lead on the silicon strip at the cool end of the apparatus where the resolidified silicon is removed. A comprehensive description of these and similar processes can be found in the article by Jean-Jacques Brissot, "*Silicium pour photopiles solaires*", *Akta Electronica*, 20, 2, 1977, pages 101 to 116.

The problem underlying the invention was, therefore, to find a process according to which silicon sheets suitable for use as base material for the manufacture of solar cells could be manufactured economically with high pulling speeds.

This problem is solved by a process embodying the present invention which is characterized in that, initially, molten silicon from a supply container is brought into contact with a non-elemental lubricating melt, which is immiscible with silicon but which will wet silicon and has a melting point below that of silicon. Then, a film of silicon is drawn off sliding over the lubricating melt, wherein one of the two largest contact surfaces of the silicon film is solidified continuously along a cooling path by supercooling to 5° to 100° C. below its melting point.

The average pulling speeds vary, according to the apparatus, between approximately 1 and 200 cm/minute. The average grain size of such granular crystalline silicon sheets is approximately at least 1 mm. "Preferred orientation" as used hereinafter means that certain directions of crystallization lie above the statistical mean, especially, that, for example, the crystallites that grow in the [111] orientation exceed the statistical mean by approximately 3 to 5 times or more.

Lubricating melts used in the process must have a melting point below that of silicon, i.e., a melting point of approximately 800° to 1400° C. and preferably approximately 1100° to 1200° C. Generally preferred as such lubricating melts are compounds the vapor pressure of which, in the temperature range of approximately 1400° to 1500° C., is as low as possible. Melts of this type should also not contain, nor deposit on the silicon, any elements or impurities which could be regarded as lifetime-killers for the minority carriers in silicon. The solubility in the silicon melt of the constituents of the lubricating melt and their impurities should also be as low as possible; in other words, the lubricating melt should not be miscible with silicon, but should result in a phase boundary between the two systems. On the other hand, however, it is necessary for the silicon to be wetted by the lubricating melt.

A small interfacial tension between the lubricating melt and the molten silicon is necessary in order to achieve or retain as best as possible a distribution of the silicon so as to form a silicon film, when the shaping of the silicon film is to be provided by other measures, e.g., a specific form of overflowing. The high surface tension of molten silicon (725 dyne/cm) as compared with that of the lubricating melts to be used (approximately 200 to 350 dyne/cm) is the reason why the molten silicon is very quickly covered by a thin film of this lubricating melt.

Especially suitable as lubricating melts are melts consisting of alkaline earth metal fluorides in admixture with 10 to 90 mole % of alkaline earth metal silicates, the composition being within the aforesaid limits and such that the melting point is below that of silicon. It is thus possible to use the fluorides and silicates of the alkaline earth elements magnesium, calcium, strontium and barium (with calcium and magnesium compounds being preferred) because of lower costs. The alkaline earth metal fluorides can be used alone, in admixture with other alkaline earth metal fluorides, or in admixture with alkaline earth metal silicates in the above-mentioned quantities.

Suitable mixtures may comprise, e.g., magnesium fluoride with calcium silicate or magnesium fluoride with magnesium silicate. Also suitable are mixtures of calcium fluoride with magnesium silicate and, preferably, mixtures of calcium fluoride and calcium silicate especially because calcium fluoride has a considerably lower vapor pressure than does magnesium fluoride.

Suitable lubricating melts, of which the melting point lies in the preferred range of approximately 1100° to 1200° C., are, for example, mixtures of calcium silicate with approximately 30 to 70 mole % of calcium fluoride. Aside from alkaline earth metal fluorides and alkaline earth metal silicates, it is also possible to use as lubricating melts other substances, for example, transition metal sulphides, such as, especially manganese or iron sulphide, which have a considerably higher density than does silicon.

It has also proved favorable, especially in the case of alkaline earth metal fluorides and alkaline earth metal silicates, to add to the lubricating melts sulphur compounds, such as, e.g., sulphides, especially those of Groups II and III of the Periodic Table of Elements, such as calcium or aluminum sulphide. This is because such additives can lower the interfacial tension between the silicon and the lubricating melt, so that the molten silicon can spread out more readily to form a thin film. Because of the lowered interfacial tension, the whole surface of the silicon melt is covered with a thin layer of lubricating melt, so that the silicon has excellent protection against oxidation.

The type and quantity of the sulphidic compounds added to the lubricating melt influence the thickness of such protective layers. If care is taken that all the vessels or apparatus components filled with molten silicon and used in the process are coated with a lubricating melt, then the process can also be carried out in the presence of air. The economic savings on the apparatus used in this respect can lead to a considerable reduction in the cost of the product of the process. In cases where the surface tension of the silicon is lowered, by additives in the lubricating melt, to such an extent that the entire silicon film is coated with a thin layer of this lubricating melt, this thin layer can remain on the solidified silicon film and, as such, can be effective as a getter substance for quickly diffusing impurities in thermal treatment processes which may optionally follow. However, on the other hand, they can also easily be removed in a subsequent etching process, e.g., by hydrogen or, especially, gaseous hydrogen chloride or hydrofluoric acid.

Other objects and features of the present invention will become apparent from the following detailed description, considered in connection with the accompanying drawings, which disclose several embodiments of the invention. It is to be understood, however, that the drawings are designed for the purpose of illustration only, and not as a definition of the limits of the invention.

In the drawings, wherein similar reference characters denote similar elements throughout the several views.

Figure 1:
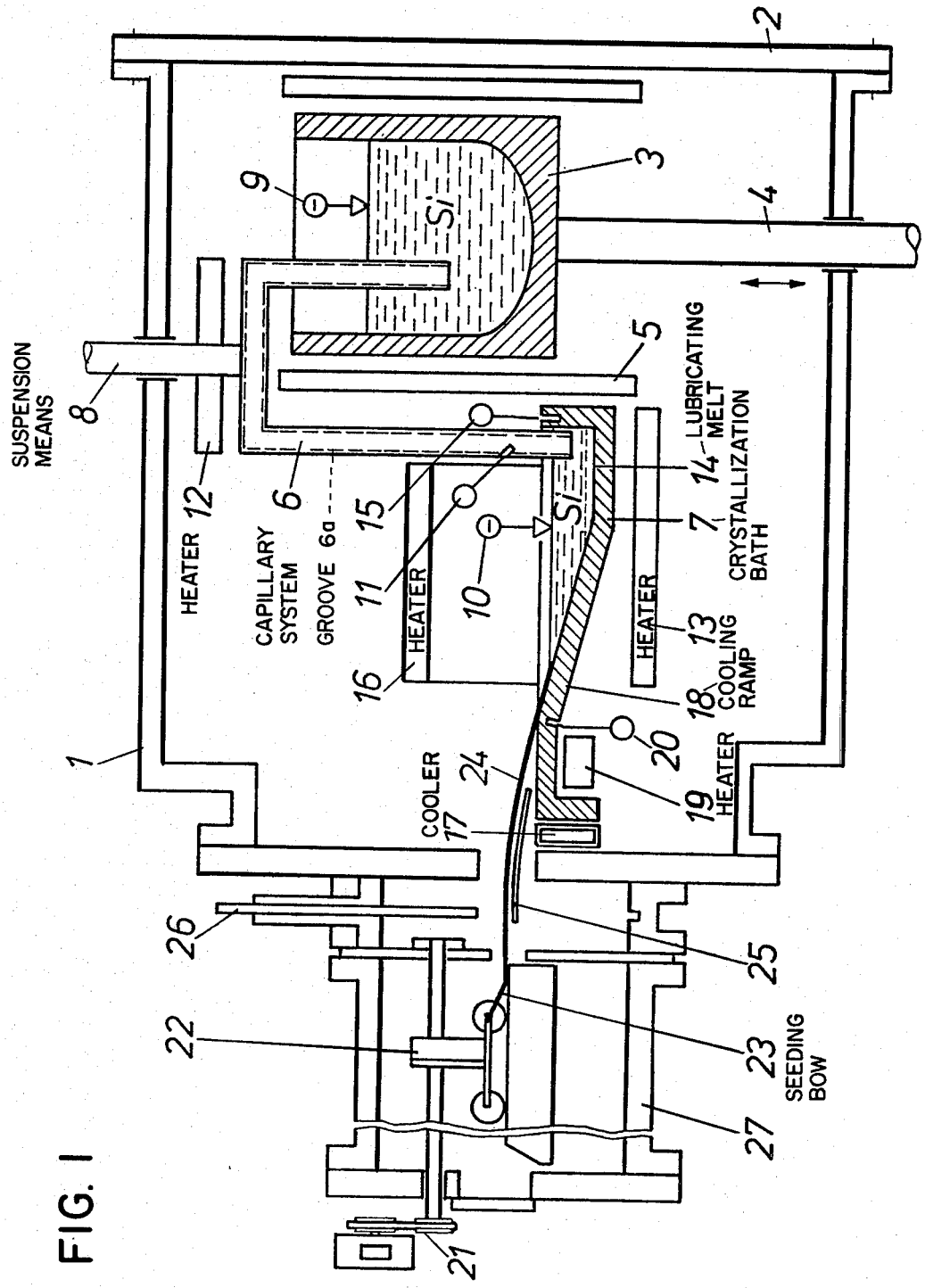
FIG. 1 is a schematically-illustrated, longitudinal sectional view of the apparatus used in association with the novel process embodying the present invention, wherein the silicon sheets are drawn off at the side.

Referring now in detail to the drawings, a vessel 1 is provided which is made, e.g., of stainless steel or silver-plated steel. Vessel 1 is advantageously of double-walled construction to accommodate a coolant such as, e.g., water. Vessel 1 can be charged with silicon through one or more closure members 2.

A melting crucible 3 is arranged in this vessel 1 so as to be movable vertically by means of a crucible shaft 4 in a heating device 5. Device 5 may comprise, e.g., a graphite tube that can be heated by a resistance heater. This large crucible 3 serves as a supply crucible and, when empty, it can be exchanged batchwise for a freshly filled crucible or it can be refilled with molten silicon by means of an appropriate adding device. The latter embodiment could be especially useful if the process according to the invention is combined with a purification process for silicon in which the silicon is obtained in molten form.

As a melting crucible 3 there may be used, for example, crucibles of glassy carbon, graphite coated with silicon carbide or silicon nitride, as well as graphite impregnated with a protective melt. The silicon located in melting crucible 3 is transported into a crystallization bath 7 by means of, e.g., a capillary system 6 operating according to the syphon principle.

Instead of using a capillary system, the silicon can be transported out of the supply vessel and into the crystallization bath by means of a displacement member inserted into the supply vessel or by forcing the silicon over by means of a gas pressure acting on the silicon melt. In such a case, a supply vessel would be used having a closed constuction and an outlet issuing into the crystallization bath.

Suitable materials for the capillary system 6 are materials that are wetted by the silicon melt. For example, silicon carbide, and graphite that is coated with silicon carbide or impregnated with silicon, are suitable. The capillaries of the overflow 6 are formed by, e.g., concentric pipes or by a solid body which is provided on its outer face with one or more grooves 6a which are arranged in the direction of the desired flow of silicon. The height of the overflow 6 used is adjusted according to the diameter of the capillary. For example, a lift or vertical height differential of 20 mm has been established for silicon in silicon carbide with a capillary diameter of 1.5 mm. In silicon-impregnated graphite with a capillary diameter of 1 mm and 0.5 mm, a lift of 49 mm and 97 mm, respectively, have been established.

Silicon overflow 6 can be inserted into melting vessel 3 and crystallization bath 7, and taken out again, by means of a suspension means 8. The difference in level between the silicon melts in crucible 3 and in crystallization bath 7 can be altered by means of crucible shaft 4. As a result, it is possible to control the quantity of silicon flowing from melt vessel 3 to crystallization bath 7 and thus to adjust the level of the melt in crystallization bath 7.

Level-regulators 9 and 10 are provided which detect the respective heights of the silicon melt in melting vessel 3 and in crystallization bath 7 electro-optically by means of ultrasonic or other known methods. They also control the vertical movement of capillary member 6 after the measured data has been compared with the corresponding desired values, advantageously by means of a computer.

A temperature measuring point 11 at the lower end of overflow 6 issuing into crystallization bath 7 registers the control magnitude for an additional heater 12, e.g., a radiation heater, which is arranged above overflow 6 and is intended to ensure that the capillary system and the syphon always have a constant temperature above the melting point of silicon. The temperature control in crystallization bath 7, which is advantageously manufactured of, e.g., graphite, is achieved by a system of several heating elements in conjunction with an appropriate cooling device.

It is advantageous if, for example, by means of a surface heater 13 underneath crystallization bath 7, the bath is heated to such an extent that the lubricating melt 14 and the remaining silicon melt are maintained in a molten state. The temperature is measured by a thermocouple 15 advantageously disposed in the wall of crystallization bath 7. In order to prevent the silicon from solidifying downward from the upper surface, it has also proved advantageous to heat the silicon at its upper surface to above the melting point of silicon by means of a further heating device, e.g., a radiation heater 16 which may, e.g., be in the form of a curved resistance-heated graphite plate. By means of a cooling system 17, e.g., a system of pipes having water flowing through it, a cooling ramp 18 is cooled to a temperature that allows the molten silicon which in the crystallization bath 7 has a temperature of approximately 5° to 10° C. above its melting point and is in direct contact with this cooling ramp, to cool down to a temperature of approximately 5° to 100° C., and preferably 10° to 50° C., below its melting point, and as a result, to solidify continuously.

The temperature at cooling ramp 18 is controlled advantageously, not by means of cooling system 17, but by means of an additional heater 19 which is arranged on the underside of cooling ramp 18 and which is especially important at the beginning of the crystallization. The temperature is determined by a thermocouple 20 mounted in the wall of the pulling or cooling ramp 18.

During the manufacture of the sheets, the heat of crystallization of the solidifying silicon is liberated at cooling ramp 18. The cooling is initiated by means of the appropriate cooling system 17 in such a manner that this additional heat can be drawn off continuously. If this temperature control is not regulated by cooling system 17, an additional heater 19 is necessary, so that, especially at the beginning of sheet manufacture, the quantity of heat that later is effective as liberated heat of crystallization, is supplied to cooling ramp 18 to ensure uniform supercooling at cooling ramp 18 during the entire process. Accordingly, during the pulling of the sheet, heaters 13, 16 and cooling system 17 are advantageously set at a constant value, and the temperature gradient along cooling ramp 18 is precisely controlled by adjusting heater 19. The values obtained at the temperature measuring points 20, 15 and 11 are compared, advantageously in a computer, with the predetermined desired values and the control values for heater 19 and, if necessary, for heater 12 as well, are determined from this.

In order to draw the silicon sheet, a seeding bow 23 is lowered, by means of a carriage 22 which is moved by a crankshaft 21 into the silicon melt along cooling ramp 18. At the same time, by adjusting the temperature along cooling ramp 18, the molten silicon, which is separated from the cooling ramp only by a thin film of lubricating melt, is cooled down to below its melting point and begins to solidify at the seeding bow 23, which has been dipped into it.

To ensure that cooling ramp 18 is well wetted by lubricating melt 14, it is advantageous if at least this portion of crystallization vessel 7 which is made of highly compacted graphite, has a surface which is coated with silicon carbide. Although this superficial layer of silicon carbide can be produced during the pulling or drawing process by reacting the carbon with silicon, it is advantageous if cooling ramp 18 has previously been siliconized, carbonized or provided with a coating of silicon nitride.

Lubricating melt 14 serves as lubricating agent for silicon sheet 24 adhering to silicon bow 23, which sheet is limited to a thickness of approximately 0.2 to 2 mm by the appropriate pulling speeds. The function of this lubricating melt 14 lies not only in its effect as lubricating agent for silicon sheet 24 to be drawn off, but it has an especially favorable effect in that, by nature, it does not contain crystallization seeds for silicon. As a result, the growth of the solidifying silicon is forced in the direction of the lowest-energy and, at the same time, kinetically-favored (111)-crystallization plane. This leads to a rapid cross-linking of the preferred orientation seeds forming at the beginning of crystallization, which ensures that growth perpendicular to cooling ramp 18 takes place considerably more slowly than growth parallel to the cooling ramp. As a result, the thickness growth of sheet 24 crystallizing out of the melt can be built up and controlled.

As there are no crystallization seeds in the lubricating melt used according to the invention, a granular crystalline growth of the silicon sheets having preferred orientation is achieved, having a grain size far larger than in the case of direct gas-phase or molten-phase growth of solid substrates. Suitable materials for the seeding bow are those which are wetted by silicon in the best possible manner. This is naturally the case with a seed crystal of silicon. Seeding bows of, e.g., graphite are also preferred which, when there are difficulties at the beginning of the crystallization process (e.g., in the case of incomplete growth of silicon on the seed crystal) make it possible to remelt the silicon by re-immersion in the melt, without the geometric shape of the seeding bow being altered as a result. The seeding can, if necessary, be repeated in this manner several times, one after the other, until a silicon sheet is obtained that grows uniformly and in the desired manner over the whole width of the seeding bow, which is crucial for the structure of the sheet.

Silicon sheet 24 solidified on seeding bow 23 is subsequently drawn over a carbon plate 25, which can be provided, at its end nearest the cooling ramp, with a stripping device for removal of lubricating melt 14. Sheet 24 is then led into a delivery connection 27 which is isolated by means of a protective gas lance 26. By blowing in inert gas (e.g., argon) by means of gas lance 26, on the one hand, silicon sheet 24 is further cooled, and on the other hand, the interior of reactor 1 is protected against the penetration of air from delivery connection 27. The sheet can then be removed from the vessel either in sections or continuously, by means of delivery connection 27.

In discontinuous operation, sheet 24 is removed from the reactor when carriage 22 supporting seeding bow 23 has travelled the whole length of delivery connection 27, and in such a manner that cooling ramp 18 is heated, for example, by turning up heater 19, to such an extent that no further silicon grows on the lower end of the solidifying silicon sheet 24.

After sheet 24 has been removed, carriage 22 carrying a fresh seeding bow 23 is inserted into vessel 1 and the crystallization process is repeated from the beginning. In continuous operation, the further transport of the silicon sheet is effected, for example, by means of a pair of rollers arranged above and below sheet 24 and located either inside or outside of delivery connection 27.

The inclination of the cooling ramp, which is approximately 10° in the embodiment shown in FIG. 1, can, in principle, be between +90° and −90° with respect to the horizontal. In the case of a 0° angle of inclination, the silicon film is, in practice, removed from a pot-shaped crystallization vessel by means of a horizontal overflow, which acts as a cooling ramp. In the case of a negative angle of inclination, the silicon overflowing from a pulling vessel of that type is drawn along a downwardly-extending cooling ramp. In the extreme case of −90°, there is used, for example, a crystallization bath or crystallization vessel of square or rectangular cross-section, of which one or more sides is constructed in the form of a cooling ramp, by means of which, and by means of appropriate slots in the floor of the vessel the silicon sheet, sliding over the lubricating melt, is pulled off downwardly. According to the invention, the cooling ramp is preferably inclined at an angle of between 0° and +90°. It usually is more favorable, for reasons of space, to draw the sheet to the side at an angle of inclination of approximately 5° to 20°.

Figure 2:
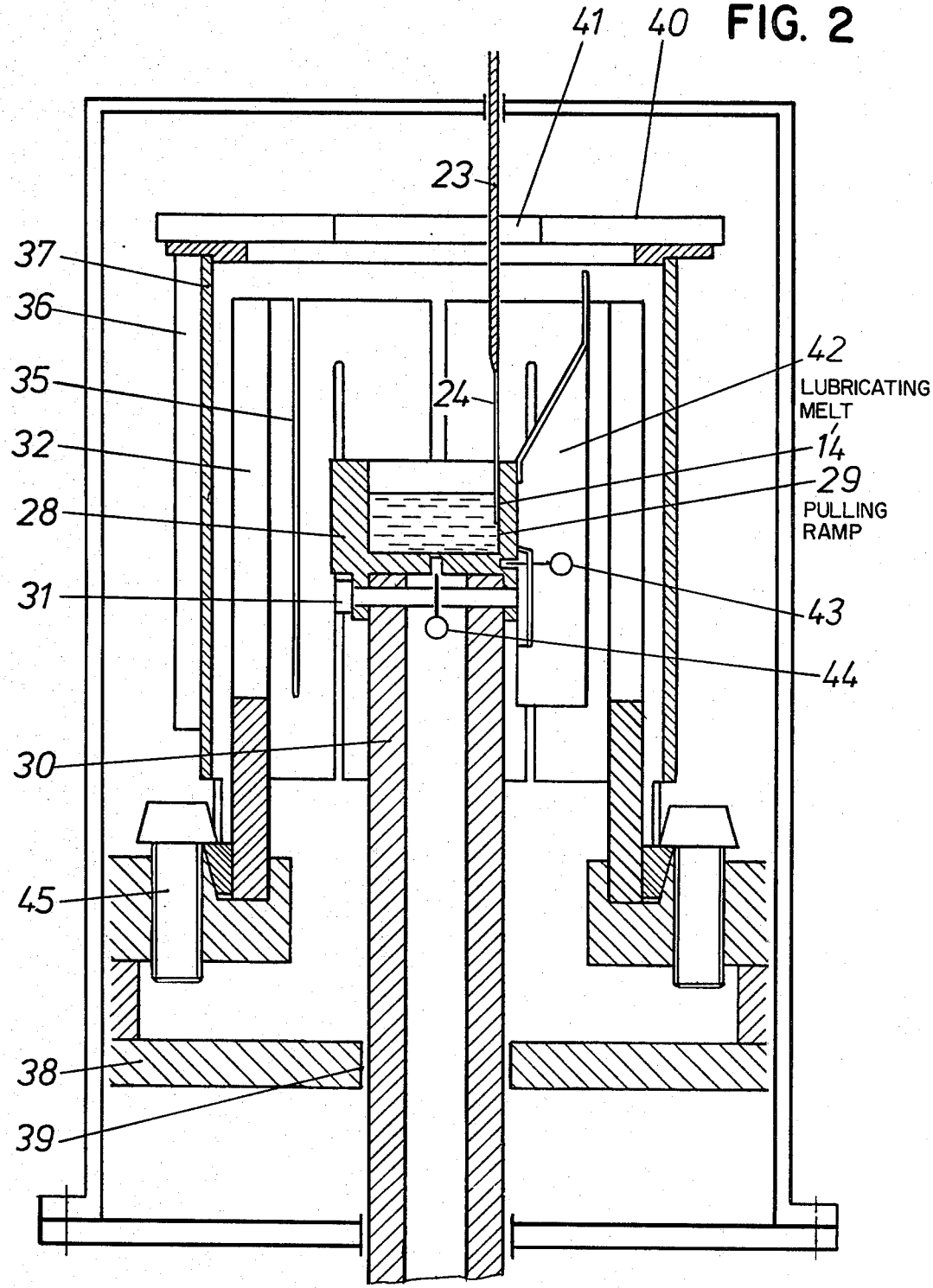
FIG. 2 is a schematically-illustrated, longitudinal sectional view of an apparatus also suitable for use in association with the novel process of the present invention, wherein the silicon sheets are drawn off upwardly.
Figure 3:
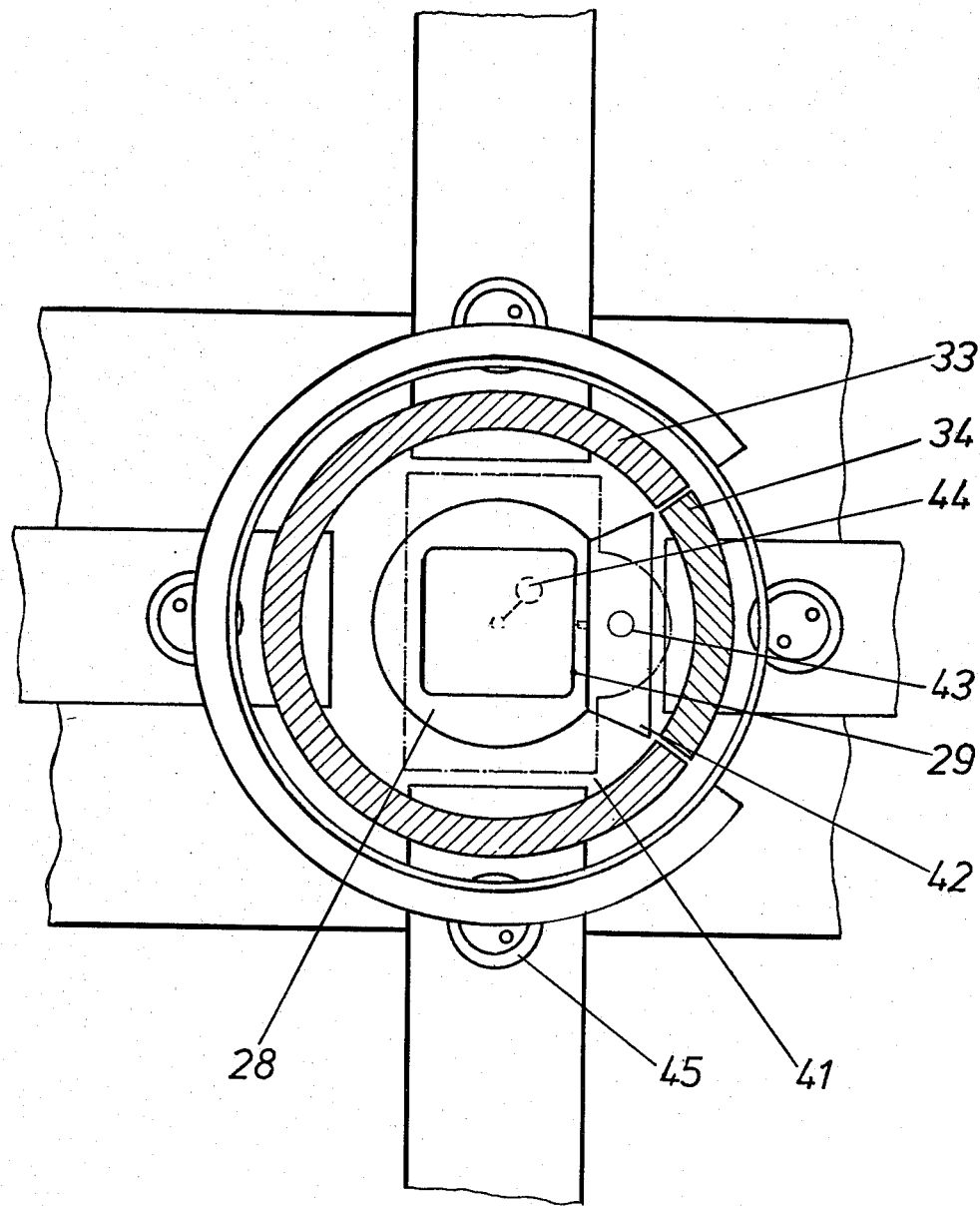
FIG. 3 is a schematically-illustrated, plan view of the apparatus shown in FIG. 2.

FIGS. 2 and 3 illustrate, in longitudinal sectional and cross-sectional views, respectively, an experimental arrangement for vertical removal. The portion of the device shown is likewise located in a vessel as is shown, for example in FIG. 1, with the only difference being that the corresponding delivery connection is arranged not to the side, but vertically above the illustrated portion of the device.

In this variant of the process, a crucible 28 of, e.g., highly-compacted graphite, having an almost square cross-sectional surface is provided, one face 29 of which serves as a pulling ramp. Crucible 28 rests on a graphite support 30 and is firmly connected to this support by an appropriate holding device 31. Graphite support 30 connects crucible 28 with a water-cooled, vertically movable crucible shaft, as is indicated by the reference numeral 4 in FIG. 1. In this way, a thermal balance is effected between crucible 28, which is heated by a crucible heater 32, and the crucible shaft, which is water-cooled for its own protection. Crucible 28 is situated in the center of a cylindrical resistance heater, which consists of two parts, namely, an actual crucible heater 33 and a ramp heater 34, as can be seen clearly in FIG. 3. The graphite tube, from which the heating system is constructed, is provided with meandering circumferential slots 35 which provide a specific current path, and thus the resistance necessary for the heating action. This heating system 32, composed of the partial heaters 33 and 34, is fed by means of four current supplies 45. For precise temperature adjustment, it is advisable to provide the crucible and the heating arrangement with a cylindrical or multiple-walled cover 36 of, e.g., molybdenum sheet, and with a suitable heat insulation base plate 38 of e.g., graphite felt. Base plate 38 has an opening 39, which is necessary for the admission of graphite support 30 resting on the water-cooled crucible shaft. In the center of a removable cover plate 40, there is an opening 41, through which the silicon strip 24 that has grown onto seed crystal bow 23 can be drawn upwards and the emptied crucible 28 can be removed and replaced with a crucible that has been freshly filled with silicon and lubricating melt.

Instead of replacing an emptied crucible by a freshly filled crucible, as is necessary in the experimental apparatus shown, the arrangement for the continuous production of corresponding silicon strips may also be extended to this embodiment by maintaining the silicon level constant by an overflow from a supply vessel according to the quantity used. A radiation plate 42 of, for example, molybdenum, is used for thermally insulating crucible heater 33 and ramp heater 34. As a result, the temperature of cooling ramp 29 can be precisely controlled by ramp heater 34, which would otherwise not be possible because of the radiation of the large heater 33 falling on ramp heater 34. The different setting of crucible heater 33 and ramp heater 34 make it possible to adjust the temperature of cooling ramp 29, the temperature being determined by the thermocouples 43 and 44 in the melt and along crystallization ramp 29.

In all of the variants of the process, the supercooling path lies along the cooling ramp where the silicon along its surface is cooled to approximately 5° to 100° C., preferably approximately 10° to 50° C., below its melting point and thus is solidified over a distance of between a few millimeters and a few centimeters. Depending on the temperature of the melt, the supercooling temperature set, and the speed with which the sheets are discharged, the supercooling portion must generally only be long enough for the silicon to solidify on the underside, that is to say, on the side towards the cooling ramp. On the surface, the discharged silicon film can still be completely coated with molten silicon, which crystallizes later during the course of discharge from the apparatus. However, it is crucial that the silicon sheet solidifies along the cooling path to a self-supporting thickness, that is to say, a sheet thickness of at least approximately 0.1 mm.

If it is desired to dope the silicon film, then, in the case of all the embodiments, this is advantageously carried out by adding the dopant to the molten silicon in the supply vessel or, if there is no such vessel provided, in the crystallization vessel, or by providing silicon that is already doped. Another possibility is to add the dopant via the lubricating melt according to the liquid/liquid distribution equilibrium. For the preferred use of the silicon sheets manufactured according to the invention, as base material for solar cells, doping is required in an amount that gives a specific resistance of approximately 0.03 to 3 ohm. cm. For p-doping it is customary to use aluminum, gallium, indium or, preferably, boron, and for n-doping, arsenic, antimony or, preferably, phosphorus.

The crystallization process as such can be carried out in a vacuum or in the presence of protective gas, and, when using a suitable lubricating melt system, also in the presence of air, if the silicon is covered on all sides with a thin film of lubricating melt.

The process according to the invention demonstrates a way in which cheap solar cell base material can be manufactured in large quantities and with an efficient mode of operation.

EXAMPLE 1

400 g of silicon, 60 g of lubricating melt consisting of equal parts of calcium fluoride and magnesium silicate, and 1 g of calcium sulphate were introduced into, and melted in, an apparatus as shown in FIG. 1. The apparatus included a graphite crystallization bath having a width of 60 mm, a length of 150 mm and a maximum depth of 50 mm. The heaters 16 and 13 shown in FIG. 1 were set at 27.5 kW and the ramp heater, indicated in FIG. 1 by the reference numeral 19, was set to an output of 14 kW. A seeding bow of graphite was subsequently inserted to a depth of 10 mm into the crystallization bath and the flow of helium in the cooling system 17 was so adjusted that the temperature of the ramp, measured by the thermocouple 20 in FIG. 1, was 1415° C. At this point, the temperature T 2, measured by the thermocouple 15, was also 1415° C.; i.e., the temperature of the silicon melt was 5° above the melting point of silicon. Ramp heater 19 was subsequently turned down to 3 kW, while it was necessary to turn up heaters 16 and 13 to 32.5 kW in order to maintain the melt temperature of 1415° C., measured at thermocouple 15, which must remain constant during the entire crystal-pulling operation.

After the ramp heater had been turned down again, the seeding bow inserted in the bath was held in position for approximately 1 minute, in order to achieve a growth corresponding to the thickness of the sheet and to ensure that a stable temperature balance was achieved. Subsequently, the seeding device with the silicon sheet that had grown onto it was pulled over the ramp, which was 150 mm long, 50 mm wide and had an angle of ascent of 10° to the horizontal, at a constantly increasing speed to a final pulling speed of 80 mm/minute.

The silicon melt was supplemented from a quartz supply vessel by means of a U-shaped overflow of high-density graphite, having 0.2 mm wide grooves on its outer face.

The silicon sheet so obtained had a granular crystalline structure, which is preferred for the manufacture of a solar cell, and had a thickness of 0.8±0.1 mm and a width of 50 mm. The length of 800 mm was determined by the pulling device.

EXAMPLE 2

A crucible of high-density graphite having an outer diameter of 100 mm, inner dimensions of 60×60 mm$^2$ and a depth of 35 mm, in an apparatus as shown in FIGS. 2 and 3, was charged with 200 g silicon and 20 g of lubricating melt consisting of 50% by weight of calcium fluoride and 50% by weight of calcium silicate (CaF$_2$/CaSiO$_3$). This was melted by setting the crucible heater to 32 kW and the ramp heater to 14 kW. After the contents of the crucible had been melted, a switch-over was made to an automatic control system. The temperature of the melt, measured with a thermocouple in the crucible wall (cf. FIGS. 2 and 3, reference numeral 44), was adjusted to correspond to a predetermined desired value of 1430° C., by turning down the ramp heater to 12 kW and the crucible heater to 30 kW. After the temperature balance had been reached, the crystallization conditions were set for the beginning of the sheet-pulling operation. For this purpose, the ramp heater was turned down to an output of 0 kW, while the crucible heater remained unchanged at an output of 30 kW. The temperature in the melt returned to 1415° C., while the thermocouple in the cooling ramp (reference numeral 43 in FIGS. 2 and 3) indicated a temperature of 1365° C. Subsequently, a seeding device was immersed, directly along the ramp 5 mm below the level of the silicon melt and, with the silicon sheet that had grown onto it, was immediately pulled vertically upwards at a slowly increasing speed. A silicon plate 50 mm in length and 3 mm in width was used as the seeding device and was fastened to a graphite holding device.

In this discontinuous process, a 50 cm long strip, determined by the dimensions of the delivery connection, having a width of approximately 50 mm and a granular crystalline structure, was pulled. In this experiment, variation in the thickness was determined by the pulling speed. The first 10 centimeters of the strip were pulled at a speed of 5 mm/min and had a thickness of 1.8 mm. A further 10 centimeters pulled at 10 mm/min produced a thickness of 1.2 mm. A further 10 centimeters pulled at 20 mm/min gave a thickness of 0.8 mm, while the remainder was pulled at a constant spped of 40 mm/min, resulting in a silicon strip having a thickness of 0.6 mm. From the pulling speeds achieved in this small experimental apparatus, it can be anticipated that, when the transition is made to production plants having correspondingly large silicon melts that can be recharged and subjected to precise temperature control, pulling speeds many times greater than those of the small experimental apparatus can be achieved. This is because in large plants the temperature relationships are hardly effected by the pulling of the silicon sheet.

While several embodiments of the present invention have been shown and described, it will be obvious that many modifications and changes may be made thereunto, without departing from the spirit and scope of the invention.

What is claimed is:

1. In a process for the manufacture of granular crystalline silicon sheets of preferred orientation, having a thickness of between 0.2 and 2 mm and suitable for use as a base material for solar cells, wherein a silicon melt is brought into contact with a second molten phase and is subsequently allowed to solidify, the improvement comprising the steps of:
   charging a pulling vessel with molten elemental silicon and a non-elemental lubricating melt which is immiscible with silicon but will wet silicon and has a melting point below that of silicon;
   supercooling at least one wall of said pulling vessel to 5° to 100° C. below the melting point of silicon; and
   continuously drawing off an elemental silicon film solidifying on said cooled wall but separated from said wall by a thin layer of the lubricating melt.

2. The process according to claim 1, wherein the molten silicon is fed from said supply vessel into said pulling vessel by means of a capillary system according to the syphon principle.

3. The process according to claim 1, additionally including the step of adding an effective amount of at least one suitable additive to the lubricating melt so that the interfacial tension between the silicon and the lubricating melt is reduced and so that the molten silicon can spread out more readily to form a thin film.

4. The process according to claim 3, wherein sulphidic additives are added to the lubricating melt to reduce the interfacial tension between the silicon and the lubricating melt.

5. The process according to claim 1, wherein a melt comprising alkaline earth metal fluorides in admixture with 10 to 90 mole % of alkaline earth metal silicates and having a melting point below that of silicon is used as said lubricating melt.

6. The process according to claim 1, wherein the level of said melt in the pulling vessel is maintained constant by controlling the inflow of molten silicon from a supply vessel.

7. The process according to claim 1, wherein said silicon film is drawn off said cooled wall at an angle between −90° and +90° with respect to the horizontal.

8. The process according to claim 3, wherein a silicon film is continuously drawn off in a vertically upward direction off a vertical wall of the pulling vessel.

9. The process according to claim 1, additionally including the step of charging said pulling vessel with an effective amount of said lubricating melt so that the entire surface of said molten silicon is covered by a thin film of said lubricating melt.

10. The process according to claim 1, wherein said silicon film is drawn at an average pulling speed between 1 and 200 cm/minute.

11. In a process for the manufacture of granular crystalline silicon sheets of preferred orientation having a thickness of between 0.2 and 2 mm and suitable for use as a base material for solar cells, wherein a silicon melt is brought into contact with a second molten phase and is subsequently allowed to solidify, the improvement comprising the steps of:

charging a pulling vessel with molten silicon and a non-elemental lubricating melt which is immiscible with silicon but will wet silicon and has a melting point below that of silicon, said lubricating melt comprising alkaline earth metal flourides in admixture with 10 to 90 mole% of alkaline earth metal silicates;

supercooling at least one wall of said pulling vessel to 50° to 100° C. below the melting point of silicon; and continuously drawing off a silicon film solidifying on said cooled wall but separated from said wall by a thin layer of the lubricating melt.

12. The process according to claim 7 or 11, additionally including the step of adding an effective amount of a surface-tension-reducing additive to said lubricating melt so that the surface of the silicon melt and the entire silicon film are covered with a thin layer of said lubricating melt.

* * * * *